United States Patent
Liang et al.

(10) Patent No.: US 9,252,146 B2
(45) Date of Patent: Feb. 2, 2016

(54) WORK FUNCTION ADJUSTMENT BY CARBON IMPLANT IN SEMICONDUCTOR DEVICES INCLUDING GATE STRUCTURE

(71) Applicant: International Business Machines Corporation, Armonk, NY (US)

(72) Inventors: Yue Liang, Sunnyvale, CA (US);
Dechao Guo, Fishkill, NY (US);
William K. Henson, Beacon, NY (US);
Shreesh Narasimha, Beacon, NY (US);
Yanfeng Wang, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/280,751

(22) Filed: May 19, 2014

(65) Prior Publication Data
US 2014/0246727 A1     Sep. 4, 2014

Related U.S. Application Data

(62) Division of application No. 13/253,268, filed on Oct. 5, 2011, now Pat. No. 8,729,637.

(51) Int. Cl.
| | |
|---|---|
| *H01L 21/70* | (2006.01) |
| *H01L 27/12* | (2006.01) |
| *H01L 21/00* | (2006.01) |
| *H01L 21/425* | (2006.01) |
| *H01L 27/092* | (2006.01) |

(Continued)

(52) U.S. Cl.
CPC ........ *H01L 27/092* (2013.01); *H01L 21/26506* (2013.01); *H01L 21/28088* (2013.01); *H01L 21/28176* (2013.01); *H01L 21/28194* (2013.01); *H01L 21/823857* (2013.01); *H01L 29/1054* (2013.01); *H01L 29/517* (2013.01)

(58) Field of Classification Search
CPC . H01L 27/092; H01L 21/26506; H01L 21/02; H01L 21/22
USPC ................. 257/369, E21.062, E21.346, 351; 438/530, 514, 157, 533
See application file for complete search history.

(56) References Cited

U.S. PATENT DOCUMENTS

| | | | |
|---|---|---|---|
| 6,043,139 A | 3/2000 | Eaglesham et al. | |
| 6,051,509 A | 4/2000 | Tsuchiaki | |

(Continued)

OTHER PUBLICATIONS

Ku K.C., "Effects of Germanium and Carbon Coimplants on Phosphorus Diffusion in Silicon", Applied Physics Letters 89:112104-1-112104-3 (2006).

*Primary Examiner* — Long K. Tran
*Assistant Examiner* — Dzung Tran
(74) *Attorney, Agent, or Firm* — Scully, Scott, Murphy & Presser, P.C.; Steven J. Meyers, Esq.

(57) ABSTRACT

A device including a p-type semiconductor device and an n-type semiconductor device on a semiconductor substrate. The n-type semiconductor device includes a gate structure having a high-k gate dielectric. A carbon dopant in a concentration ranging from $1\times10^{16}$ atoms/cm$^3$ to $1\times10^{21}$ atoms/cm$^3$ is present at an interface between the high-k gate dielectric of the gate structure for the n-type semiconductor device and the semiconductor substrate. Methods of forming the aforementioned device are also disclosed.

19 Claims, 6 Drawing Sheets

(51) Int. Cl.
*H01L 21/8238* (2006.01)
*H01L 21/265* (2006.01)
*H01L 21/28* (2006.01)
*H01L 29/10* (2006.01)
*H01L 29/51* (2006.01)

(56) References Cited

U.S. PATENT DOCUMENTS

| | | | |
|---|---|---|---|
| 6,072,217 A * | 6/2000 | Burr | 257/351 |
| 6,548,842 B1 * | 4/2003 | Bulucea et al. | 257/288 |
| 6,916,698 B2 * | 7/2005 | Mocuta et al. | 438/217 |
| 2002/0151153 A1 * | 10/2002 | Drobny et al. | 438/492 |
| 2003/0173626 A1 * | 9/2003 | Burr | 257/369 |
| 2004/0031979 A1 | 2/2004 | Lochtefeld et al. | |
| 2006/0134872 A1 * | 6/2006 | Hattendorf et al. | 438/300 |
| 2007/0148888 A1 * | 6/2007 | Krull et al. | 438/306 |
| 2009/0130805 A1 | 5/2009 | Babcock et al. | |
| 2010/0148271 A1 * | 6/2010 | Lin et al. | 257/369 |
| 2011/0049642 A1 | 3/2011 | Scheiper et al. | |
| 2011/0263086 A1 * | 10/2011 | Pan | 438/259 |
| 2013/0087859 A1 | 4/2013 | Liang et al. | |

* cited by examiner

WORK FUNCTION ADJUSTMENT BY CARBON IMPLANT IN SEMICONDUCTOR DEVICES INCLUDING GATE STRUCTURE

CROSS REFERENCE TO RELATED APPLICATION

This application is a divisional of U.S. patent application Ser. No. 13/253,268, filed on Oct. 5, 2011, the entire content and disclosure of which are incorporated herein by reference.

BACKGROUND

The present disclosure relates generally to semiconductor devices, and more particularly to threshold voltage modifications in semiconductor devices.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). With scaling of electrical devices potentially reaching their limits, other means of modifying device performance have been contemplated.

SUMMARY

In one embodiment, a method of forming a semiconductor device is provided that includes forming a high-k gate dielectric layer on a semiconductor substrate including an n-type semiconductor device region and a p-type semiconductor device region. At least one metal containing layer is formed in contact with the high-k gate dielectric layer. The at least one metal containing layer may include at least one n-type threshold voltage shift dopant over the n-type semiconductor device region. The at least one n-type threshold voltage shift dopant may be diffused from the at least one metal containing layer to the high-k dielectric interface. A carbon dopant may be selectively implanted through the metal containing layer to an interface between the high-k gate dielectric layer and the semiconductor substrate in the n-type device region. A first gate structure may be formed in the n-type device region and a second gate structure may be formed in the p-type device region, wherein each of the first gate structure and the second gate structure comprise a portion of the high-k gate dielectric layer. A source regions and a drain region may be formed on opposing sides of the first gate structure and the second gate structure.

In another embodiment, a method of forming a semiconductor device is provided that includes forming a high-k gate dielectric layer on a semiconductor substrate including an n-type semiconductor device region and a p-type semiconductor device region, and forming at least one metal containing layer in contact with the high-k gate dielectric layer. The at least one metal containing layer comprises at least one n-type threshold voltage shift dopant over the n-type semiconductor device region. The at least one n-type threshold voltage shift dopant is diffused from the at least one metal containing layer to the high-K dielectric interface. The at least one metal containing layer may then be removed selectively to the high-k gate dielectric layer, and at least one gate conductor layer may be formed on the high-k gate dielectric layer. A carbon dopant may then be selectively implanted through the at least one gate conductor layer to an interface between the high-k gate dielectric layer and the semiconductor substrate in the n-type semiconductor device region. A first gate structure may be formed in the n-type semiconductor device region and a second gate structure may be formed in the p-type semiconductor device region, wherein each of the first gate structure and the second gate structure comprise a portion of the high-k gate dielectric layer.

In yet another embodiment, a method of forming a semiconductor device is provided that includes forming a high-k gate dielectric layer on a semiconductor substrate including an n-type semiconductor device region and a p-type semiconductor device region, and forming at least one metal containing layer in contact with the high-k gate dielectric layer. The at least one metal containing layer includes at least one of a p-type threshold voltage shift dopant over the p-type semiconductor device region and an n-type threshold voltage shift dopant over the n-type semiconductor device region. At least one of the p-type threshold voltage shift dopant and the n-type threshold voltage shift dopant may then be diffused from the at least one metal containing layer to the semiconductor substrate. The at least one metal containing layer may then be removed selectively to the high-k gate dielectric layer, and at least one gate conductor layer may then be formed on the high-k gate dielectric layer. A first gate structure is formed in the n-type semiconductor device region and a second gate structure is formed in the p-type semiconductor device region, wherein each of the first gate structure and the second gate structure comprise a portion of the high-k gate dielectric layer. A carbon dopant may then be selectively implanted through the at least one gate conductor layer to an interface between the high-k gate dielectric layer and the semiconductor substrate in the n-type semiconductor device region.

In another aspect of the present disclosure, a semiconductor device is provided that may include a semiconductor substrate having a first semiconductor device region and a second semiconductor device region, in which a p-type semiconductor device is present in the first semiconductor device region and an n-type semiconductor device is present in the second semiconductor device region. The p-type semiconductor device includes a first gate structure, wherein a first source region and first drain region having a p-type conductivity are present on opposing sides of the first gate structure. The first gate structure of the p-type semiconductor device includes a first gate conductor layer overlying a first high-k gate dielectric layer. The n-type semiconductor device includes a second gate structure, wherein a second source region and second drain region having an n-type conductivity are present on opposing sides of the second gate. The second gate structure includes a second gate conductor layer overlying a second high-k gate dielectric layer, wherein a carbon dopant at a concentration ranging from $1\times10^{16}$ atoms/cm$^3$ to $1\times10^{21}$ atoms/cm$^3$ is present at an interface between the second high-k gate dielectric layer and the semiconductor substrate.

DESCRIPTION OF THE DRAWINGS

The following detailed description, given by way of example and not intended to limit the invention solely thereto, will best be appreciated in conjunction with the accompanying drawings, wherein like reference, numerals denote like elements and parts, in which.

DETAILED DESCRIPTION

Figure 1:
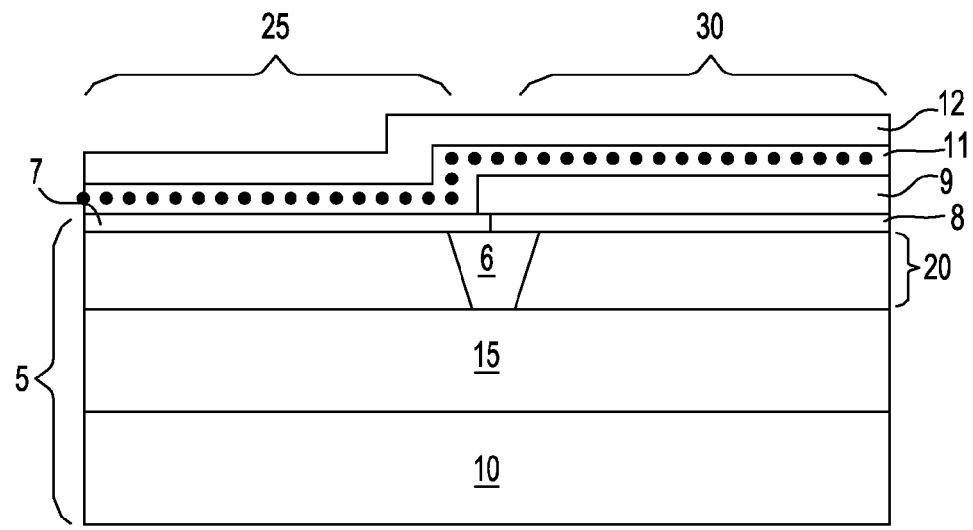
FIG. 1 is a side cross-sectional view depicting an initial structure as used in one embodiment of a method of forming a semiconductor device, wherein the initial structure includes a high-k gate dielectric layer on a semiconductor substrate including an n-type semiconductor device region and a p-type semiconductor device region, and at least one metal containing layer in contact with the high-k gate dielectric layer, in accordance with the present disclosure.

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the present disclosure provides a method of forming a complementary metal oxide semiconductor (CMOS) device including an n-type semiconductor device in a first region of a substrate and a p-type semiconductor device in a second region of the semiconductor substrate, wherein a carbon dopant region is present at an interface of the high-k gate dielectric of the gate structure to the n-type semiconductor device and the semiconductor substrate. The carbon dopant region effectuates an n-type threshold voltage shift in the n-type semiconductor device. The term "n-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In some embodiments, an n-type semiconductor device including the carbon dopant region has a threshold voltage ranging from 4.1 mV to 4.6 mV. As used herein, "threshold voltage" is the lowest attainable gate voltage that will turn on a semiconductor device, e.g., transistor, by making the channel of the device conductive.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. In the following description, the semiconductor device is a field effect transistor. A "field effect transistor" is a transistor in which output current, i.e., source-drain current, is controlled by the voltage applied to a gate structure. A field effect transistor has three terminals, i.e., a gate structure, source region and drain region. As used herein, the term "source" is a doped region in the semiconductor device, in which majority carriers are flowing into the channel. As used herein, the term "channel" is the region underlying the gate structure and between the source and drain of a semiconductor device that becomes conductive when the semiconductor device is turned on. As used herein, the term "drain" means a doped region in a semiconductor device located at the end of the channel, in which carriers are flowing out of the transistor through the drain. A "gate structure" means a structure used to control output current (i.e., flow of carriers in the channel) of a semiconducting device through electrical or magnetic fields. Although the semiconductor devices described herein are field effect transistors (FETs), the present disclosure is equally applicable to any semiconductor device that exhibits a change in conductivity in response to the application of a threshold voltage.

FIG. 1 illustrates the results of initial processing steps that produce a semiconductor substrate 5, i.e., semiconductor on insulator (SOI) substrate. The semiconductor substrate 5 comprises at least a first semiconductor layer 20 (hereafter referred to as an SOI layer 20) overlying a dielectric layer 15. In some embodiments, the SOI layer 20 has a thickness of less than 10 nm and may be referred to as an extremely thin SOI (ESTSOI) layer. A second semiconductor layer 10 (hereafter referred to as base semiconductor layer 10) may be present underlying the dielectric layer 15.

The SOI layer 20 may comprise any semiconducting material including, but not limited to Si, strained Si, SiC, SiGe, SiGeC, Si alloys, Ge, Ge alloys, GaAs, InAs, and InP, or any combination thereof. The SOI layer 20 may be thinned to a desired thickness by planarization, grinding, wet etch, dry etch, oxidation followed by oxide etch, or any combination thereof. One method of thinning the SOI layer 20 is to oxidize the silicon by a thermal dry or wet oxidation process, and then wet etch the oxide layer using a hydrofluoric acid mixture. This process can be repeated to achieve the desired thickness. In one embodiment, the SOI layer 20 has a thickness ranging from 1.0 nm to 10.0 nm. In another embodiment, the SOI layer 20 has a thickness ranging from 1.0 nm to 5.0 nm. In a further embodiment, the SOI layer 20 has a thickness ranging from 3.0 nm to 8.0 nm The base semiconductor layer 10 may be a semiconducting material including, but not limited to Si, strained Si, SiC, SiGe, SiGeC, Si alloys, Ge, Ge alloys, GaAs, InAs, InP as well as other III/V and II/VI compound semiconductors. In addition to semiconductor on insulator (SOI) substrates, the substrate may also be provided by a bulk semiconductor substrate, such as a silicon bulk substrate.

The dielectric layer 15 that may be present between the SOI layer 20 and atop the base semiconductor layer 10 may be formed by implanting a high-energy dopant into the substrate 5 and then annealing the structure to form a buried insulating layer, i.e., dielectric layer 15. In another embodiment, the dielectric layer 15 may be deposited or grown prior to the formation of the SOI layer 20. In yet another embodiment, the semiconductor substrate 5 may be formed using a wafer-bonding technique, where a bonded wafer pair is formed utilizing glue, adhesive polymer, or direct bonding.

The semiconductor substrate 5 may further include a trench isolation region 6. The trench isolation region 6 can be formed by etching a trench in the SOI layer 20 utilizing a dry etching process, such as reactive-ion etching (RIE) or plasma etching. The trench may optionally be lined with a liner material, e.g., an oxide, and then CVD or another like deposition process is used to fill the trench with oxide grown from tetraethylorthosilicate (TEOS) precursors, high-density oxide or another like trench dielectric material. After trench dielectric fill, the structure may be subjected to a planarization process.

The trench isolation region 6 separates an n-type semiconductor device region 25 from a p-type semiconductor device region 30 of the semiconductor substrate 5. The n-type semiconductor device region 25 is the portion of the semiconductor substrate 5 that is subsequently processed to provide an n-type semiconductor device, such as an nFET, and the p-type semiconductor device region 30 is the portion of the semiconductor substrate 5 that is subsequently processed to provide a p-type semiconductor device, such as a pFET. Therefore, in one embodiment, the n-type semiconductor device region 25 may include a well region doped to a p-type conductivity, and the p-type semiconductor device region 25 may include well region doped to an n-type conductivity. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium. As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous. The concentration of dopant in the well region may range from $1 \times 10^{16}$ atoms/cm$^3$ to $1 \times 10^{20}$ atoms/cm$^3$.

FIG. 1 further depicts at least one high-k gate dielectric layer 7, 8 that is present on an upper surface of the semiconductor substrate 5. As used herein, the term "high-k" denotes a dielectric material having a dielectric constant that is greater than the dielectric constant of silicon oxide ($SiO_2$). For example, in one embodiment, the high-k dielectric material that provides the at least one high-k gate dielectric layer 7, 8 may have a dielectric constant at room temperature, e.g., 20° C. to 25° C., and atmospheric pressure, e.g., 1 atm, of 4.0 or greater. In another embodiment, the high-k dielectric material that provides the at least one high-k gate dielectric layer 7, 8 has a dielectric constant that is greater than 7.0. The high k dielectric material of the high-k gate dielectric layer 7, 8 may include, but is not limited to, an oxide, nitride, oxynitride and/or silicate including metal silicates and nitrided metal silicates. In one embodiment, the high-k gate dielectric layer 7, 8 is comprised of an oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectrics suitable for use as the high-k gate dielectric layer 7, 8 in the present method include hafnium silicate and hafnium silicon oxynitride.

The high-k gate dielectric layer 7, 8 can be formed by a thermal growth process such as, for example, oxidation, nitridation or oxynitridation. The high-k gate dielectric layer 7, 8 can also be formed by a deposition process such as, for example, chemical vapor deposition (CVD), plasma-assisted CVD, metal-organic chemical vapor deposition (MOCVD), atomic layer deposition (ALD), evaporation, reactive sputtering, chemical solution deposition and other like deposition processes. The high-k gate dielectric layer 7, 8 may also be formed utilizing any combination of the above processes. The high-k gate dielectric layer 7, 8 typically has a thickness ranging from 1 nm to 10 nm. In one example, the high-k gate dielectric layer 7, 8 has a thickness ranging from 2 nm to 5 nm. In one embodiment, the high-k gate dielectric layer 7, 8 is in direct physical contact with a surface, e.g., upper surface, of the substrate 5. In some embodiments, an interfacial layer of a silicon-containing oxide, such as silicon oxide or silicon oxynitride, may be present between the high-k gate dielectric layer 7, 8 and the semiconductor substrate 5.

In FIG. 1 the high-k gate dielectric layer 7, 8 is depicted has having a first portion 7 over the n-type semiconductor device region 25 and a second portion 8 over the p-type semiconductor device region 30. The first portion 7 of the high-k gate dielectric layer may be composed of a different dielectric material as the second portion 8 of the high-k gate dielectric layer. In this embodiment, the first portion 7 of the high-k gate dielectric layer may be an independent and separate layer from the second portion 8 of the high-k gate dielectric layer. In another embodiment, the first portion 7 of the high-k gate dielectric layer may be composed of the same material as the second portion 8 of the high-k gate dielectric layer. In this embodiment, the first portion 7 of the high-k gate dielectric layer is the same material layer as the second portion 8 of the high-k gate dielectric layer.

Still referring to FIG. 1, at least one metal containing layer may then be formed atop the high-k gate dielectric layer 7, 8. In the embodiment that is depicted in FIG. 1, the at least one metal containing layer includes a p-type metal layer 9 over the p-type semiconductor device region 30 and an n-type work function metal layer 11 that is present over at least the n-type semiconductor device region 25.

In one embodiment, the p-type metal layer 9 is provided by an aluminum containing conductive material, which may be substantially pure aluminum. In one embodiment, by "substantially pure" aluminum it is meant that the aluminum content of the p-type metal layer 9 is greater than 99.0%. In some embodiments, the aluminum content of the p-type metal layer 9 may be greater than 99.5%. The p-type metal layer 9 of aluminum containing conductive material may have a thickness of less than 10 Å. In one embodiment, the p-type metal layer 9 of aluminum containing conductive material has a thickness ranging from 1 Å to 5 Å. In another embodiment, the p-type metal layer 9 of aluminum containing conductive material has a thickness that ranges from 2 Å to 3 Å.

The p-type metal layer 9 of aluminum containing conductive material may be deposited by a physical vapor deposition (PVD) method, such as sputtering. As used herein, "sputtering" means a method of depositing a film of metallic material, in which a target of the desired material, i.e., source, is bombarded with particles, e.g., ions, which knock atoms from the target, and the dislodged target material deposits on the deposition surface. Examples of sputtering apparatus that may be suitable for depositing the aluminum containing p-type metal layer 9 include DC diode type systems, radio frequency (RF) sputtering, magnetron sputtering, and ionized metal plasma (IMP) sputtering.

In one embodiment, a sputtering deposition process for depositing the p-type metal layer 9 of aluminum containing conductive material includes applying high energy particles to strike a solid slab of high-purity aluminum target material, in which the high energy particles physically dislodge atoms of the aluminum to be deposited on the high-k gate dielectric layer 7, 8. In one example, the ion energies of the high-energy particles, e.g., positive ions from an argon gas flow discharge, range from 500 eV to 5,000 eV. In another embodiment, the ion energies of the high-energy particles range from 1,500 eV to 4,500 eV. In one embodiment, by high-purity aluminum it is meant that the aluminum content of the target material is greater than 99.0%.

Although physical vapor deposition (PVD) techniques have been described above for forming the p-type metal layer 9 of aluminum containing conductive material, chemical vapor deposition (CVD) and atomic layer deposition (ALD) can also be contemplated as a suitable deposition methods for forming the p-type metal layer 9 of aluminum containing conductive material.

In another embodiment, the p-type metal layer 9 may be composed of titanium aluminum nitride (TiAlN). In one example, the titanium content of the titanium aluminum nitride may range from 20 wt % to 80 wt %; the aluminum content of the titanium aluminum nitride may range from 20 wt % to 60 wt %; and the nitrogen content of the titanium aluminum nitride may range from 20 wt % to 60 wt %. In another example, the titanium content of the titanium aluminum nitride may range from 30 wt % to 60 wt %; the aluminum content of the titanium aluminum nitride may range from 25 wt % to 40 wt %; and the nitrogen content of the titanium aluminum nitride may range from 25 wt % to 50 wt %.

The titanium aluminum nitride may be deposited using physical vapor deposition (PVD), such as sputtering. In one embodiment, a sputtering deposition process for depositing titanium aluminum nitride (TiAlN) includes applying high energy particles to strike a solid slab of a titanium aluminum alloy target material, in which the high energy particles physically dislodge atoms of titanium and aluminum to be deposited on the high-k gate dielectric layer 7, 8. In another embodiment, the sputtering apparatus may include dual targets, e.g., a first target composed of titanium and a second target composed of aluminum. The sputtered atoms of titanium and aluminum typically migrate through a vacuum and deposit on the deposition surface, e.g., the high-k gate dielectric layer 7, 8.

The source of nitrogen for the titanium aluminum nitride (TiAlN) may be provided by nitrogen gas ($N_2$). The nitrogen source may be introduced to the sputtering chamber as the sputtered atoms of titanium and aluminum are migrating towards the deposition surface, e.g., the high-k gate dielectric layer 7, 8. In one example, the nitrogen source is provided by co-sputtering from a titanium (Ti) and an aluminum (Al) target in an $Ar/N_2$ gas mixture. In one example, the p-type metal layer 9 composed of titanium aluminum nitride may be in direct physical contact with a surface, e.g., upper surface, of the high-k gate dielectric layer 7, 8.

Still referring to FIG. 1, in some embodiments, following blanket deposition of the p-type metal layer 9, the portion of the p-type metal layer 9 may be removed form the n-type semiconductor device region 25, while the remaining portion of the p-type metal layer 9 is positioned overlying at least the p-type semiconductor device region 30. The p-type metal layer 9 may be patterned using photolithography and etching. In one example, an etch mask may be formed atop the portion of the p-type metal layer 9 that is overlying the p-type semiconductor device region 30, while the portion of the p-type metal layer 9 overlying the n-type semiconductor device region 25 is exposed. The etch mask typically protects the portion of the p-type metal layer 9 that is overlying the p-type semiconductor device region 30, wherein the portions exposed by the etch mask are removed by an anisotropic etch process, such as a reactive ion etch (RIE). Reactive ion etch is a form of plasma etching, in which the surface to be etched is placed on the RF powered electrode and takes on a potential that accelerates an etching species, which is extracted from a plasma, towards the surface to be etched, wherein a chemical etching reaction takes place in the direction normal to the surface being etched. In one embodiment, the etch mask may be provided by a patterned photoresist layer.

The n-type work function metal layer 11 is formed atop the first portion 7 of the high-k gate dielectric layer that is present in the n-type semiconductor device region 25 and atop the remaining portion of the p-type metal layer 9 that is present in the p-type semiconductor device region 30. As indicated above, an "n-type work function metal layer" is a metal layer that effectuates an n-type threshold voltage shift. For example, a dopant from the n-type work function metal layer 11 may diffuse to the semiconductor substrate 5, which contains the channel of the subsequently formed n-type semiconductor device. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV.

In some embodiments, the n-type work function metal layer 11 may be composed of TiN, TaN, WN or a combination thereof In one embodiment, the n-type work function metal layer 11 may have a thickness ranging from 25 Å to 200 Å. In another embodiment, the n-type work function metal layer 11 has a thickness ranging from 50 Å to 100 Å. The n-type work function metal layer 11 may be deposited using physical vapor deposition (PVD), such as sputtering. In one embodiment, the sputtering deposition process for forming the n-type work function metal layer 11 includes applying high-energy particles to strike a solid slab of a metal target material to provide the metal constituent of the n-type work function metal layer 11, such as titanium. The high-energy particles physically dislodge metal atoms of target material, which are then deposited on the deposition surface.

The source of nitrogen for an n-type work function metal layer 11 that is composed of TiN, TaN, or WN may be provided by nitrogen gas ($N_2$). The nitrogen source may be introduced to the sputtering chamber as the sputtered atoms of the metal constituent of the n-type work function metal layer 11 are migrating towards the deposition surface, e.g., the first portion 7 of the high-k gate dielectric layer in the n-type semiconductor device region 25, and the p-type metal layer 9 in the p-type semiconductor device region 30. In one example, an n-type work function metal layer 11 is composed of titanium nitride (TiN), in which the titanium concentration ranges from 30% to 70%. In another example, the titanium concentration of the titanium nitride (TiN) metal nitride layer ranges from 45% to 55%.

The dopant that diffuses from the n-type work function metal layer 11 to the dielectric interface overlying the semiconductor substrate 5 thatcontains the channel of the subsequently formed n-type semiconductor device to effectuate the n-type work function shift may include lanthanum, ytterbium or a combination thereof. In some embodiments, the dopant may be introduced to the type work function metal layer 11 by ion implantation.

FIG. 1 further depicts forming a semiconductor-containing layer 12 on the n-type work function metal layer 11 in the n-type semiconductor device region 25, and the p-type metal layer 9 in the p-type semiconductor device region 30. The semiconductor-containing layer 12 may be composed of polycrystalline or amorphous Si, SiGe, SiGeC or combinations thereof. In one example, the conductive semiconductor-containing layer 12 is composed of a single layer of polysilicon or amorphous silicon. The semiconductor-containing layer 12 may be formed by chemical vapor deposition (CVD) or physical vapor deposition (PVD). Variations of CVD processes suitable for forming the semiconductor-containing layer 12 include, but are not limited to, Atmospheric Pressure CVD (APCVD), Low Pressure CVD (LPCVD) and Plasma Enhanced CVD (EPCVD), Metal-Organic CVD (MOCVD) and combinations thereof. The semiconductor-containing layer 12 has a thickness ranging from 1 nm to 20 nm. In one example, the semiconductor-containing layer 12 has a thickness ranging from 5 nm to 10 nm.

Figure 2:
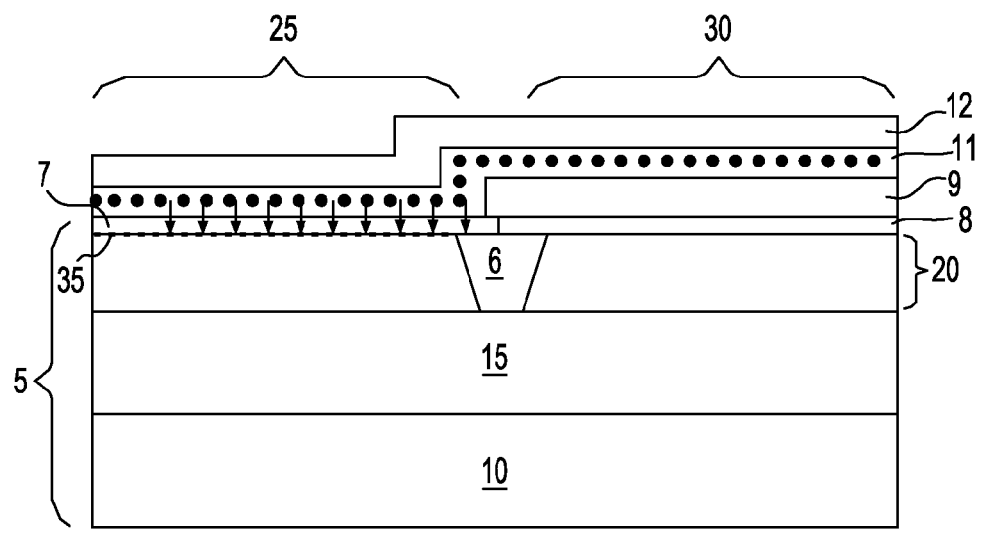
FIG. 2 is a side cross-sectional view depicting diffusing the n-type threshold voltage shift dopant from the at least one metal containing layer to the high-k dielectric interface, in accordance with one embodiment of the present disclosure.

FIG. 2 depicts diffusing the at least one of the n-type threshold voltage shift dopant from the at least one metal containing layer, e.g., n-type work function metal layer 11, to the high-k gate dielectric interface that is present at the direct contact between the lower surface of the high-k gate dielectric layer 7 and the upper surface of the semiconductor substrate 5. In one embodiment, in which the n-type work function metal layer 11 is composed of TiN, the n-type threshold voltage shift dopant that is diffused into the semiconductor substrate 5 in the n-type semiconductor device region 25 is titanium. In one embodiment, the n-type threshold voltage shift dopant is diffused from the at least one metal containing layer to the semiconductor substrate 5 using thermal annealing. For example, the n-type threshold voltage shift dopant may be diffused to the semiconductor structure 5 by a thermal anneal at a temperature ranging from 800° C. to 1200° for a time period ranging from 1 second to 100 minutes. In another embodiment, the n-type threshold voltage shift dopant may be diffused to the semiconductor structure 5 by a thermal anneal at a temperature ranging from 900° C. to 1000° C. for a time period ranging from 5 seconds to 10 minutes. Thermal annealing may be provided by rapid thermal anneal (RTA), furnace annealing, laser annealing or combinations thereof.

In one embodiment following thermal annealing, and when the metal containing layer that is in direct contact with the n-type semiconductor device region 25 is an n-type work function metal layer 9 composed of titanium nitride, the n-type threshold voltage shift dopant is lanthanum, etc, the lanthanum that has diffused to and is present in the surface of SOI layer 20 of the n-type semiconductor device region 25 is present in a concentration ranging from $1 \times 10^{16}$ atoms/cm$^3$ to $1 \times 10^{21}$ atoms/cm$^3$. In another embodiment, following thermal annealing, when the metal containing layer is an n-type work function metal layer 9 composed of titanium nitride, the lanthanum that has diffused into the surface of SOI layer 20 of the n-type semiconductor device region 25 is present in a concentration ranging from $1 \times 10^{17}$ atoms/cm$^3$ to $1 \times 10^{19}$ atoms/cm$^3$.

Figure 3:
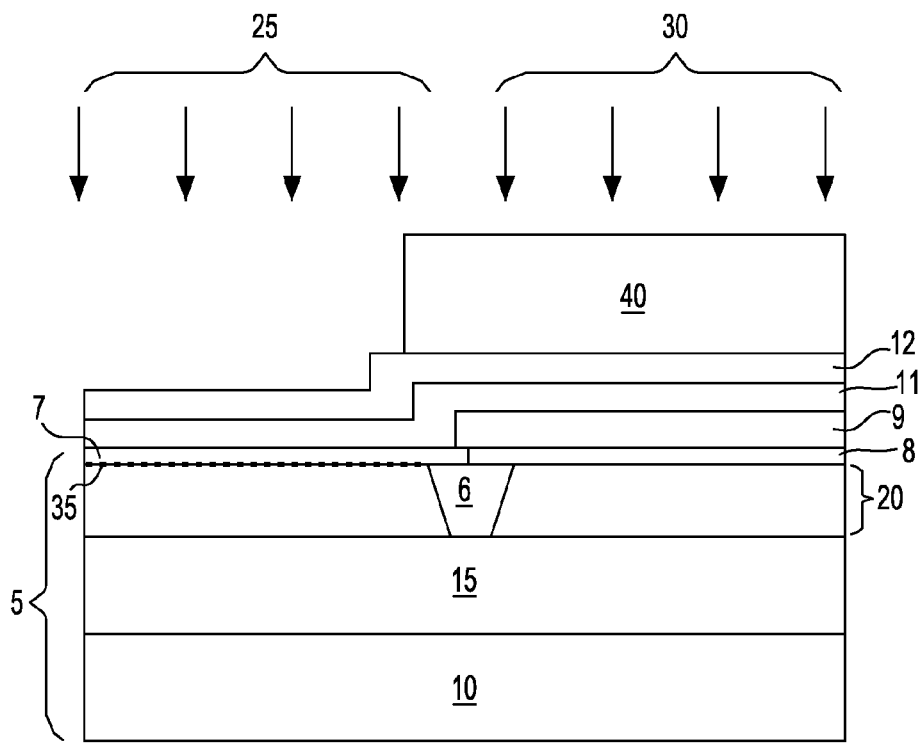
FIG. 3 is a side cross-sectional view depicting selectively implanting a carbon dopant through the at least one metal containing layer to an interface between the high-k dielectric layer and the semiconductor substrate in the n-type semiconductor device region, in accordance with one embodiment of the present disclosure.

FIG. 3 depicts selectively implanting a carbon dopant 35 (also referred to as carbon dopant region 35) through the at least one metal containing layer to an interface between the high-k dielectric layer 7, 8 and an upper surface of the semiconductor substrate 5 in the n-type semiconductor device region 25. In the embodiments, in which an interface dielectric layer, such as silicon oxide ($SiO_2$), is present between the semiconductor substrate 5 and the high-k dielectric layer 7, 8, the carbon dopant region 35 may be present at the interface between the semiconductor substrate 5 and the interface dielectric layer. Similar to the n-type work function metal layer described above, the carbon dopant may effectuate an n-type threshold voltage shift. An n-type threshold voltage shift is a shift in the Fermi energy of an n-type semiconductor device towards a conduction band of silicon in a silicon-containing substrate of the n-type semiconductor device. In some embodiments, an n-type semiconductor device including the carbon dopant region 35 has a threshold voltage ranging from 4.1 mV to 4.6 mV.

In one embodiment, to selectively implant the carbon dopant through the metal containing layer to the interface between the first portion 7 of the high-k gate dielectric layer and the SOI layer 20 of the semiconductor substrate 5 in the n-type semiconductor device region 25, a block mask 40 is formed on the portion of the semiconductor-containing layer 12 that is present over the p-type semiconductor device region 30, and carbon is ion implanting into the n-type semiconductor device region 25. More specifically, the carbon dopant is implanted through the exposed portion of the SOI layer 20 in the n-type semiconductor device region 25, while the p-type semiconductor device region 30 of the semiconductor substrate 5 is protected from being implanted by the block mask 40. The block mask 40 is formed by using deposition and photolithography processes. For example, a layer of photoresist is deposited atop the entire structure. The photoresist layer may be comprised of dielectrics including carbon, oxygen, and various inorganic metals. The photoresist layer may be selectively patterned and developed to form the block mask 40.

In one embodiment, the carbon dopant 35 may be implanted using ion implantation. As used herein, "ion implantation" is a process of introducing impurities, such as carbon, into solids by directing a beam of ions at the solid. The beam of ions may be accelerated in an electrical field towards the surface to be implanted. Ion implantation equipment typically consists of an ion source, e.g., carbon source, an accelerator, where the ions are electrostatically accelerated to a high energy, and a target chamber, where the ions impinge on a target, which is the material to be implanted.

In one embodiment, the energy of the ion implantation is selected so that the carbon dopant is implanted through the semiconductor-containing layer 12, the n-type work function metal layer 9, and the first portion 7 of the high-k gate dielectric layer into the SOI layer 20 of the n-type semiconductor device region 25. Typical ion implant energies for ion implanting carbon to the interface between the first portion 7 of the high-k gate dielectric layer and the SOI layer 20 of the semiconductor substrate 5 may range from 10 keV to 25 keV. In another embodiment, the ion implant energies for ion implanting carbon to the interface between the first portion 7 of the high-k gate dielectric layer and the SOI layer 20 of the semiconductor substrate may range from 15 keV to 20 keV. In some embodiments, the dose of carbon dopant may range from $1\times10^{12}$ atoms/cm$^2$ to $1\times10^{17}$ atoms/cm$^2$. In another embodiment, the dose of the carbon dopant may range from $1\times10^{13}$ atoms/cm$^2$ to $1\times10^{15}$ atoms/cm$^2$.

The carbon dopant region 35 may extend to a depth into the semiconductor substrate 5 ranging from 1 nm to 20 nm, as measured from the upper surface of the SOI layer 20. In another embodiment, the carbon dopant region 35 may extend to a depth into the semiconductor substrate 5 ranging from 1 nm to 10 nm, as measured from the upper surface of the SOI layer 20. The carbon dopant concentration in the carbon dopant region 35 may range from $1\times10^{16}$ atoms/cm$^3$ to $1\times10^{21}$ atoms/cm$^3$. In another embodiment, the carbon dopant concentration in the carbon dopant region 35 may range from $1\times10^{18}$ atoms/cm$^3$ to $1\times10^{20}$ atoms/cm$^3$.

Figure 4:
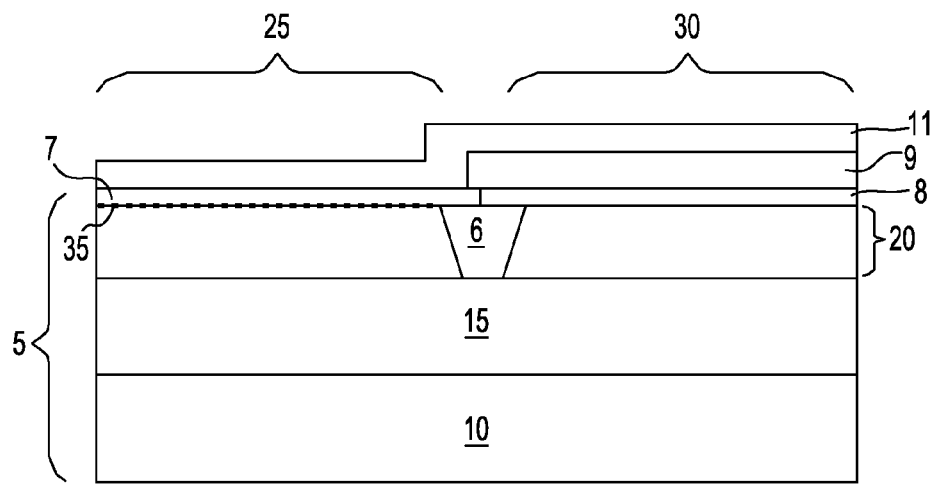
FIG. 4 is a side cross-sectional view depicting removing a semiconductor-containing layer from an upper surface of the at least one metal containing layer, in accordance with one embodiment of the present disclosure.

FIG. 4 depicts one embodiment of removing the block mask 40 and the semiconductor-containing layer 12. In one embodiment, the block mask 40 is removed using selective etching. As used herein, the term "selective" in reference to a material removal process denotes that the rate of material removal for a first material is greater than the rate of removal for at least another material of the structure to which the material removal process is being applied. In some examples, the selectivity may be greater than 100:1, e.g., 1000:1. In another embodiment, the block mask 40 may be removed using oxygen ashing.

FIG. 4 further depicts removing the semiconductor-containing layer 12. In one embodiment, the semiconductor-containing layer 12 is removed by an etch that is selective to the n-type work function metal layer 11. In one embodiment, the etch chemistry for removing a semiconductor-containing layer 12 composed of amorphous silicon selectively to the n-type work function metal layer 11 may include a treatment with ammonium (NH$_4$OH).

Figure 5:
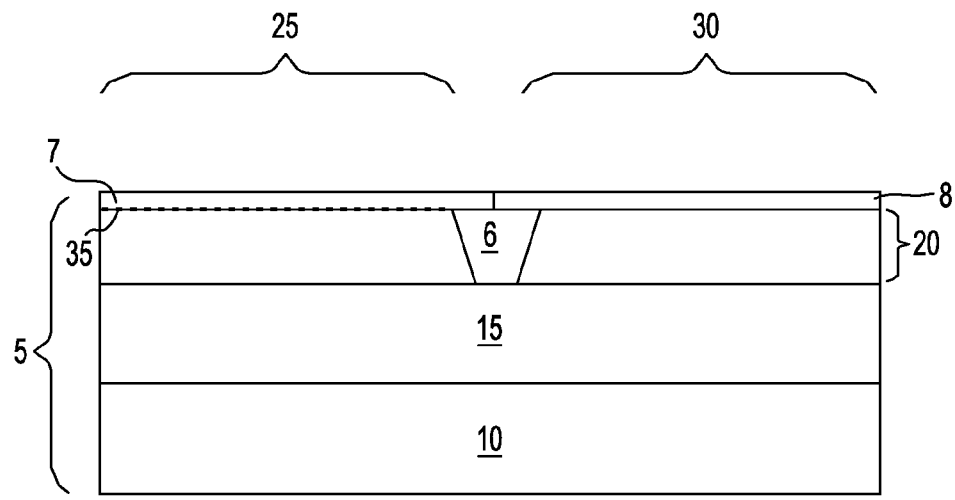
FIG. 5 depicts removing the at least one metal containing layer selectively to the high-k gate dielectric layer, in accordance with one embodiment of the present disclosure.

FIG. 5 depicts removing the at least one metal containing layer selectively to the high-k gate dielectric layer 7, 8. In the embodiments, in which the at least one metal containing layer includes a p-type metal layer 9 composed of an aluminum-containing material and an n-type work function metal layer 11 composed of titanium nitride, the at least one metal containing layer may be removed by an etch having a hydrochloric acid (HCl) composition.

Figure 6:
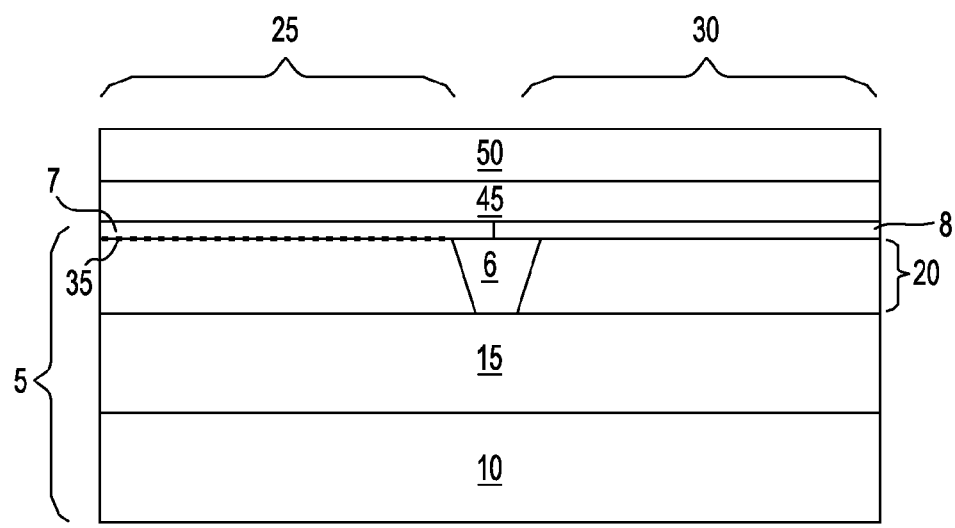
FIG. 6 depicts forming at least one gate conductor layer on the high-k gate dielectric layer, in accordance with one embodiment of the present disclosure.

FIG. 6 depicts forming at least one gate conductor layer on the high-k gate dielectric layer 7, 8. In one embodiment, the at least one gate conductor layer comprises a metal containing gate conductor 45 that is present on the high-k gate dielectric layer 7, 8 and a semiconductor gate conductor layer 50 present on the metal containing gate conductor 45. The metal containing gate conductor 45 may be any conductive metal including, but not limited to W, Ni, Ti, Mo, Ta, Cu, Pt, Ag, Au, Ru, Ir, Rh, and Re, and alloys that include at least one of the aforementioned conductive elemental metals. The metal containing gate conductor 45 may have a thickness ranging from 1 nm to 70 nm. The metal containing gate conductor layer 45 may be formed using physical vapor deposition, such as sputtering, or chemical vapor deposition (CVD), such as metal organic precursor chemical vapor deposition and/or plasma enhanced chemical vapor deposition. The semiconductor gate conductor layer 50 may be a doped semiconductor material, such as a doped silicon containing material, e.g., n-type or p-type doped polysilicon. The semiconductor gate conductor layer 50 may have a thickness ranging from 1 nm to 5 nm. The semiconductor gate conductor layer 50 may be formed using chemical vapor deposition (CVD), such as metal organic precursor chemical vapor deposition and/or plasma enhanced chemical vapor deposition, wherein the dopant is introduced to the semiconductor gate conductor layer 50 using ion implantation or insitu doping. In some embodiments, an optional diffusion barrier material, such as TaN or WN, may be formed between the metal containing gate conductor 45 and the semiconductor gate conductor layer 50.

Figure 7:
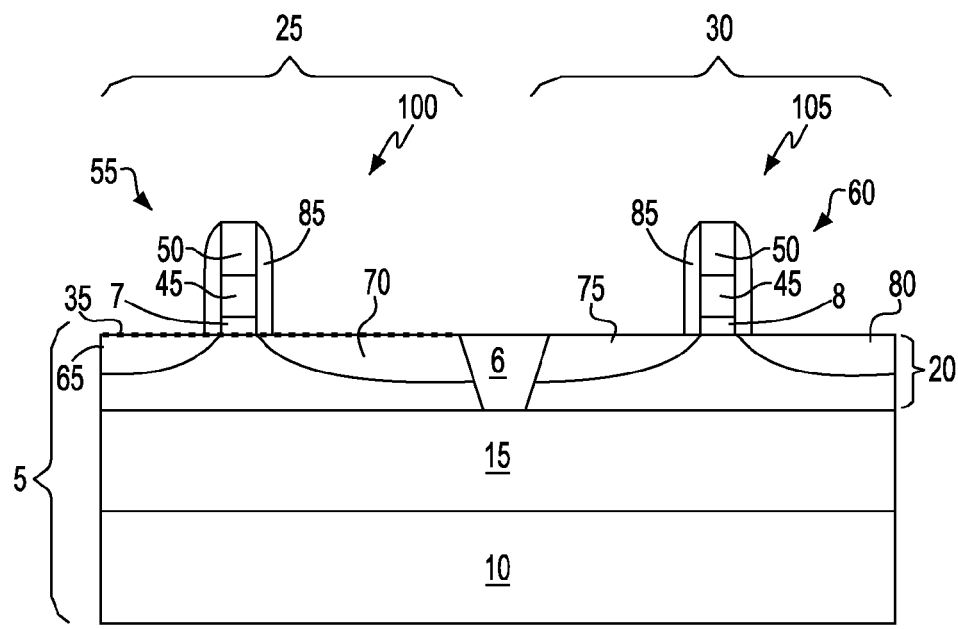
FIG. 7 is a side-sectional view depicting one embodiment of a semiconductor device structure including an n-type semiconductor device on a first portion of a semiconductor substrate and a p-type semiconductor device on a second portion of the semiconductor substrate, wherein the n-type semiconductor device includes a carbon dopant at an interface between the high-k gate dielectric of the gate structure to the n-type semiconductor device and the semiconductor substrate, in accordance with the present disclosure.

FIG. 7 depicts patterning the semiconductor gate conductor layer 50, the metal gate conductor layer 45 and the high-k gate dielectric layer 7, 8 to form a first gate structure 55 in the first semiconductor device region 25 (also referred to as n-type semiconductor device region 25), and a second gate structure 60 in the second semiconductor device region 30 (also referred to as p-type semiconductor device region 30). In one embodiment, forming the first gate structure 55 and the second gate structure 50 includes forming an etch mask (not shown) over a portion of the at least one gate conductor layer 50 corresponding to the first gate structure 55 and the second gate structure 60, and anisotropically etching exposed portions of the semiconductor gate conductor layer 50, the metal gate conductor layer 45 and the underlying portions of the high-k gate dielectric layer 7, 8 selective to the etch mask and the semiconductor substrate 5. The etch mask for forming the first and second gate structures 55, 60 may be composed of a photoresist material and may be similar to the block mask 40 that is depicted in FIG. 3. The anisotropic etch process for forming the first and second gate structures 55, 60 may be reactive ion etch. A spacer 85 may be formed in direct physical contact with the sidewalls of the first and second gate structures 55, 60. The spacer 85 may be composed of oxide, i.e., SiO$_2$, but may also comprise nitride or oxynitride materials. Each spacer 85 may have a width ranging from 50.0 nm to 100.0 nm. The spacer 85 can be formed by deposition and etch processes.

FIG. 7 further depicts implanting dopants into the semiconductor substrate 5 to provide an n-type source region 65 and n-type drain region 70 in the n-type semiconductor device region 25, and a p-type source region 75 and a p-type drain region 80 in the p-type semiconductor device region 30. The n-type source region 65, n-type drain region 70 region, p-type source region 75 and p-type drain region 80 may be formed using an ion implantation process. For producing the n-type source region 65 and n-type drain region 70 region, group V elements from the Periodic Table of Elements are implanted into a semiconductor substrate 5 that is composed of a group IV element of the periodic table of elements. For producing the p-type source region 75 and p-type drain region 80 group III elements from the Periodic Table of Elements are implanted into a semiconductor substrate 5 that is composed of a group IV element of the periodic table of elements. Separate processing of the n-type semiconductor device region 25 and the p-type semiconductor device region 30 may be provided using block masks. In one embodiment, the n-type source region 65, n-type drain region 70, p-type source region 75 and p-type drain region 80 may be activated using a thermal anneal. The anneal process may be provided by thermal anneal, such as a furnace anneal, rapid thermal anneal or laser anneal.

As discussed above, the carbon dopant region 35 that is present in the n-type semiconductor device region 25 provides an n-type work function shift to the channel region of the semiconductor device. The n-type work function shift creates a threshold voltage shift of ranging from 60 mV to 400 mV for the n-type field effect transistors 100 that are present in the n-type semiconductor device region 25. In another embodiment, the n-type work function shift provided by the carbon dopant region 35 creates a threshold voltage shift of ranging from 70 mV to 90 mV for the n-type field effect transistors that are present in the n-type semiconductor device region 25. In one example, the n-type work function shift provided by the carbon dopant region 35 creates a threshold voltage shift of 80 mV for the n-type field effect transistors that are present in the n-type semiconductor device region 25. In some embodiments, the n-type field effect transistors 100 have a threshold voltage ranging from 4.1 mV to 4.6 mV. In another embodiment, the n-type field effect transistors 100 have a threshold voltage ranging from 4.1 mV to 4.3 mV. The p-type field effect transistors 105 that are present in the p-type semiconductor device region 30 may have a threshold voltage ranging from 4.7 mV to 5.2 mV. In another embodiment, the p-type field effect transistors 105 that are present in the p-type semiconductor device region 30 may have a threshold voltage ranging from 4.9 mV to 5.2 mV.

Figure 8:
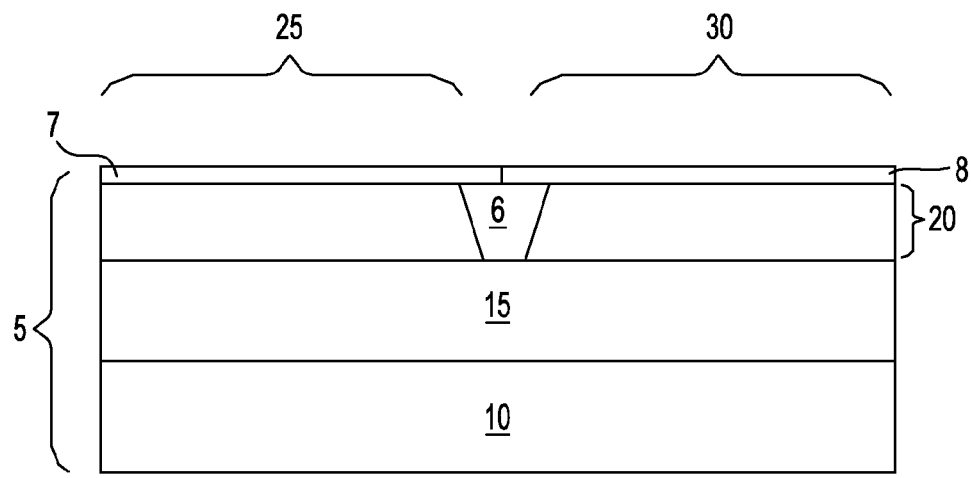
FIG. 8 is a side cross-sectional view of another embodiment of the present disclosure, wherein the at least one metal containing layer is removed from the structure depicted in FIG. 2.
Figure 9:
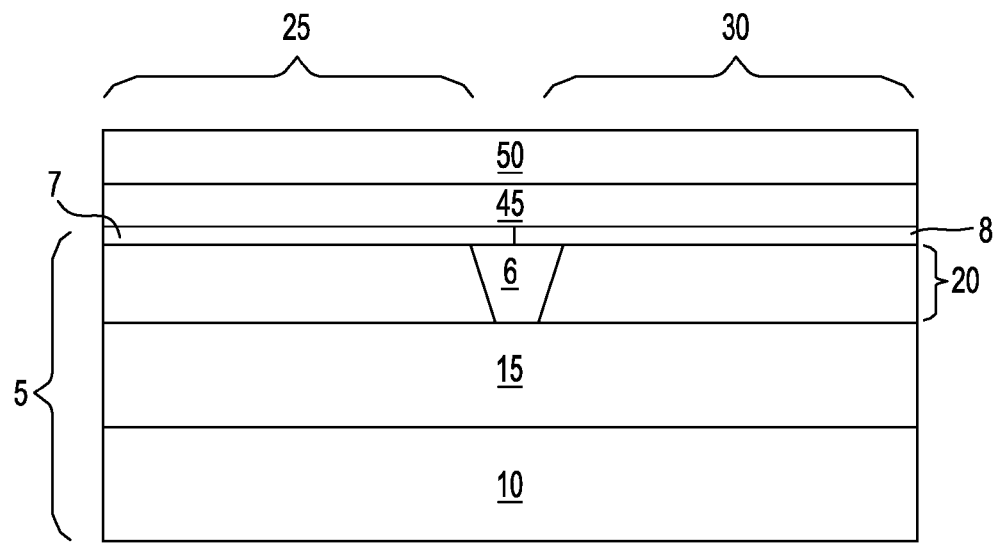
FIG. 9 is a side cross-sectional view depicting forming at least one gate conductor layer on the high-k gate dielectric layer depicted in FIG. 8, in accordance with one embodiment of the present disclosure.
Figure 10:
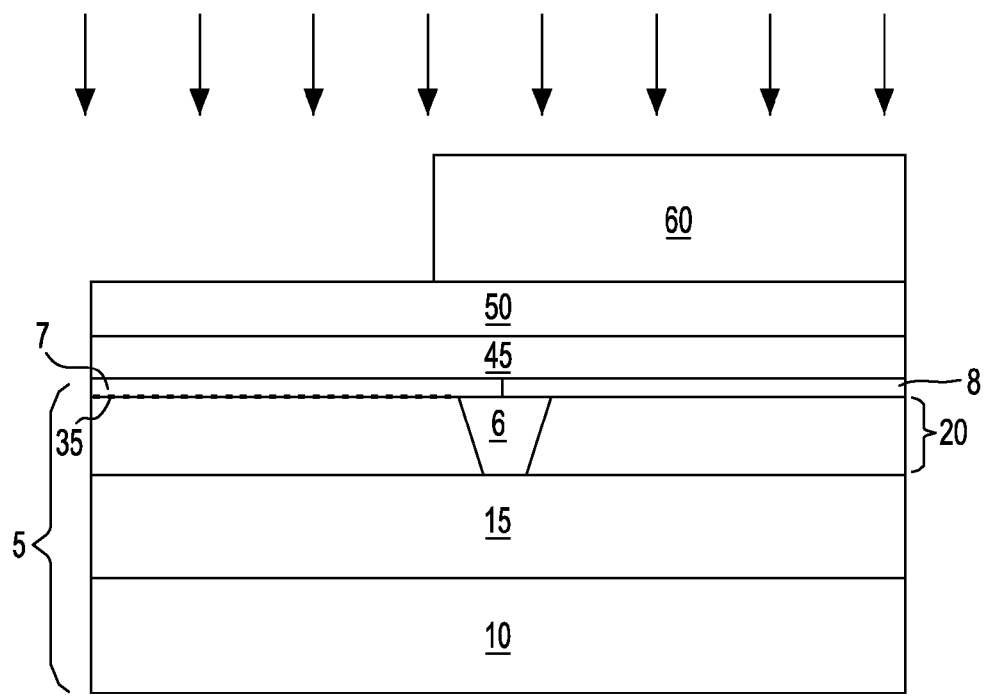
FIG. 10 is a side cross-sectional view depicting selectively implanting a carbon dopant through the at least one gate conductor layer depicted in FIG. 9, wherein the carbon dopant is implanted to an interface between the high-k gate dielectric layer and the semiconductor substrate in the n-type semiconductor device region, in accordance with one embodiment of the present disclosure.

The process sequence depicted in FIGS. 1-7 represents only one embodiment of the present disclosure. Other initial, intermediate and following process steps may be employed. Further, the sequence of processing steps may also be modified. For example, FIGS. 8-10 depict another embodiment of a method of forming semiconductor devices, in which the carbon dopant region 35 is formed after the at least one gate conductor layer has been formed on the high-k gate dielectric layer 7, 8. Similar to the embodiments described above with reference to FIGS. 1-7, in this embodiment the method may being with forming a high-k gate dielectric layer 7, 8 on a semiconductor substrate 5 including an n-type semiconductor device region 25 and a p-type semiconductor device region 30 and forming at least one metal containing layer, e.g., p-type metal layer 9 and n-type work function metal layer 11, in contact with the high-k gate dielectric layer 7, 8. The semiconductor substrate 5, high-k gate dielectric layer 7, 8, n-type semiconductor device region 25 and a p-type semiconductor device region 30 have been described above with reference to FIG. 1. An n-type threshold voltage shift dopant from the at least one metal containing layer may then be diffused into the semiconductor substrate 5 using a thermal anneal, as describe above with reference to FIG. 2.

Referring to FIG. 8, starting with the structure depicted in FIG. 2, following thermal anneal, the at least one metal containing layer, e.g., n-type work function metal layer 11 and p-type metal layer 9, is removed selectively to the high-k gate dielectric layer 7, 8. In the embodiments, in which the at least one metal containing layer includes a p-type metal layer 11 composed of an aluminum-containing material and an n-type work function metal layer 9 composed of titanium nitride, the at least one metal containing layer may be removed by an etch having a hydrochloric acid (HCl) composition.

FIG. 9 depicts forming at least one gate conductor layer on the high-k gate dielectric layer. In one embodiment, the at least one gate conductor layer comprises a metal containing gate conductor 45 that is present on the high-k gate dielectric layer 7, 8 and a semiconductor gate conductor layer 50 present on the metal containing gate conductor 45. The metal containing gate conductor 45 and the semiconductor gate conductor layer 50 have been described above with reference to FIG. 6.

FIG. 10 depicts selectively implanting a carbon dopant through the at least one gate conductor layer, e.g., semiconductor gate conductor layer 50 and metal containing gate conductor 45, to form a carbon dopant region 35 at an interface between the high-k gate dielectric layer 7 and the semiconductor substrate 5 in the n-type semiconductor device region 25. Similar to the embodiments described above with reference to FIGS. 1-7, to selectively implant the carbon dopant through the at least one gate conductor layer, e.g., the semiconductor gate conductor layer 50 and the metal containing gate conductor 45, to the interface between the first portion 7 of the high-k gate dielectric layer and the semiconductor substrate 5 in the n-type semiconductor device region 25, a block mask 60 may be formed on the metal containing layer over the p-type semiconductor device region 30. Thereafter, the carbon dopant may be implanted into the n-type semiconductor device region 25, while the block mask 60 protects the p-type semiconductor device region 30 from being doped with carbon.

The block mask 60 depicted in FIG. 10 is similar to the block mask 40 that is depicted in FIG. 3. The process variables for implanting a carbon dopant through the at least one gate conductor layer, e.g., semiconductor gate conductor layer 50 and metal containing gate conductor 45, are similar to the process variable for forming the carbon dopant region 35 that is described above with reference to FIG. 3. Therefore, the above description of ion implanting the carbon dopant into the semiconductor substrate 5 with reference to FIG. 3 is suitable for the description of forming the carbon dopant region 35 that is depicted in FIG. 10.

Following the formation of the carbon dopant region 35, the structure depicted in FIG. 10 may be further processed to form a first gate structure in the n-type semiconductor device region 25 and a second gate structure in the p-type semiconductor device region 30, and to form a p-type source region and p-type drain region in the p-type semiconductor, and to form an n-type source region and n-type drain region in the n-type semiconductor device region 25. The details of these processes, and related processes, have been described above with reference to FIG. 7.

In another embodiment of the present disclosure, a carbon dopant is implanted to form a carbon dopant region 35 at the interface between a first portion 7 of a high-k dielectric layer and a semiconductor substrate 5 in an n-type semiconductor device region 25 of a semiconductor substrate 5 after a portion of the gate structure has been patterned. In one embodiment, beginning with the structure depicted in FIG. 9, the semiconductor gate conductor layer 50 is etched to provide at least a portion of the first gate structure 55 in the n-type semiconductor device region 25 and at last a portion of the second gate structure 60 in the p-type semiconductor device region 30. In one embodiment, forming the first gate structure 55 and the second gate structure 50 includes forming an etch mask (not shown) over a portion of the at least one gate conductor layer 50 corresponding to the first gate structure 55 and the second gate structure 60, and anisotropically etching exposed portions of the semiconductor gate conductor layer 50 selective to the etch mask and the metal gate conductor layer 45. The etching process may be provided by reactive ion etch (RIE).

Figure 11:
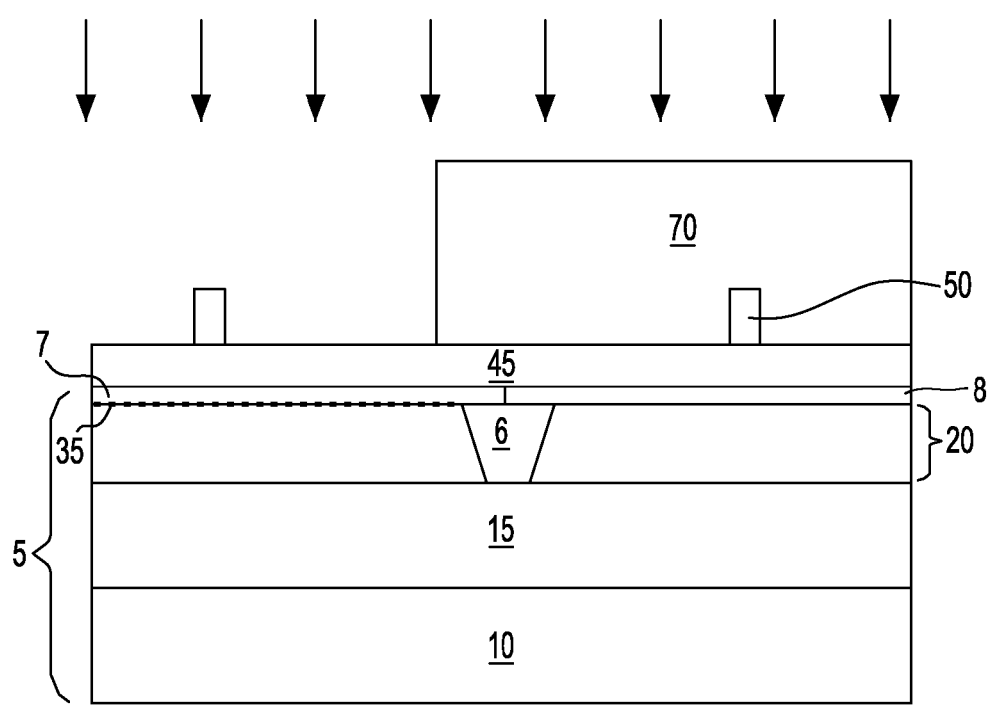
FIG. 11 is side cross-sectional view of another embodiment of the present disclosure, in which a carbon dopant is implanted to the interface between a high-k dielectric layer and a semiconductor substrate in an n-type semiconductor device region of a semiconductor substrate, wherein the carbon implant is conducted after a portion of the gate structure has been patterned.

Following patterning of the semiconductor gate conductor layer 50, carbon dopant may be implanted through the semiconductor gate conductor layer 50 and the metal containing gate conductor 45 to an interface between the first portion 7 of the high-k gate dielectric layer and the semiconductor substrate 5 in the n-type semiconductor device region 25. Similar to the embodiments described above with reference to FIGS. 1-7, to selectively implant the carbon dopant through the remaining portion of the semiconductor gate conductor layer 50 and the metal containing gate conductor 45 to the interface between the first portion 7 of the high-k dielectric layer and the semiconductor substrate 5 in the n-type semiconductor device region 25, a block mask 70 is formed over the p-type semiconductor device region 30. The block mask 70 depicted in FIG. 11 is similar to the block mask 40 that is depicted in FIG. 3. The process variables for implanting the carbon dopant through the remaining portion of the semiconductor gate conductor layer 50 and the metal containing gate conductor 45 are similar to the process variable for forming the carbon dopant region 35 that is described above with reference to FIG. 3. Therefore, the above description of ion implanting the carbon dopant into the semiconductor substrate 5 with reference to FIG. 3 is suitable for the description of forming the carbon dopant region 35 that is depicted in FIG. 11.

Following the formation of the carbon dopant region 35, the structure depicted in FIG. 11 may be further processed to form a first gate structure in the n-type semiconductor device region 25 and a second gate structure in the p-type semiconductor device region 30, and to form a p-type source region and p-type drain region in the p-type semiconductor, and to form an n-type source region and n-type drain region in the n-type semiconductor device region 25. The details of these processes, and related processes, have been described above with reference to FIG. 7.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor device comprising:
a semiconductor substrate comprising a first device region and a second device region;
a p-type semiconductor device in the first device region comprising a first gate structure and a first source region and a first drain region on opposing sides of the first gate structure having a p-type conductivity, wherein the first gate structure comprises a first gate conductor layer overlying a first high-k gate dielectric layer; and
an n-type semiconductor device in the second device region comprising a second gate structure and a second source region and a second drain region on opposing sides of the second gate structure having an n-type conductivity, wherein the second gate structure comprises a second gate conductor layer overlying a second high-k gate dielectric layer and a spacer in direct physical contact with outer sidewalls of said second gate conductor layer and said second high-k gate dielectric layer, wherein a bottommost surface of said spacer is in direct physical contact with a topmost surface of a carbon dopant, wherein said carbon dopant is present at an interface between the second high-k gate dielectric layer, the spacer and the semiconductor substrate, and wherein said carbon dopant is present across an entirety of a topmost surface of said semiconductor substrate in the second device region.

2. The semiconductor device of claim 1, wherein the semiconductor substrate comprises silicon.

3. The semiconductor device of claim 1, wherein the semiconductor substrate comprises at least one semiconductor layer and a dielectric layer.

4. The semiconductor device of claim 1, wherein the semiconductor substrate comprises a trench isolation region positioned between said p-type semiconductor device and said n-type semiconductor device.

5. The semiconductor device of claim 1, wherein the carbon dopant is not present at an interface between the first high-k gate dielectric layer and the semiconductor substrate.

6. The semiconductor device of claim 1, wherein the threshold voltage of the n-type semiconductor device ranges from 4.1 mV to 4.6 mV.

7. The semiconductor device of claim 1, wherein the threshold voltage of the p-type semiconductor device ranges from 4.7 mV to 5.2 mV.

8. The semiconductor device of claim 1, wherein said first gate conductor layer comprises a metal containing gate conductor portion and a semiconductor gate conductor portion on said metal containing gate conductor portion.

9. The semiconductor device of claim 8, wherein said metal containing gate conductor portion comprises a conductive metal selected from the group consisting of W, Ni, Ti, Mo, Ta, Cu, Pt, Ag, Au, Ru, Ir, Rh, Re, and alloys thereof.

10. The semiconductor device of claim 8, wherein said a semiconductor gate conductor layer comprises a doped semiconductor material.

11. The semiconductor device of claim 1, wherein said first high-k gate dielectric layer and said second high-k gate dielectric layer are comprised of different dielectric materials.

12. The semiconductor device of claim 1, wherein the second gate conductor layer of the n-type semiconductor substrate comprises lanthanum and the second high-k gate dielectric layer comprises hafnium dioxide.

13. The semiconductor device of claim 1, wherein the first gate conductor layer of the p-type semiconductor substrate comprises aluminum and the first high-k gate dielectric layer comprises hafnium dioxide.

14. The semiconductor device of claim 1, further comprising another spacer, wherein said another spacer is in direct physical contact with the outer sidewalls of the first gate structure.

15. The semiconductor device of claim 1, wherein the carbon dopant concentration ranges from $1\times10^{18}$ atoms/cm$^3$ to $1\times10^{20}$ atoms/cm$^3$.

16. The semiconductor device of claim 1, wherein said second source region and said second drain region include group V elements.

17. The semiconductor device of claim 1, wherein said first source region and said first drain region include group III elements.

18. The semiconductor device of claim 1, wherein said carbon dopant concentration ranges from $1\times10^{16}$ atoms/cm$^3$ to $1\times10^{21}$ atoms/cm$^3$.

19. The semiconductor device of claim 1, wherein a portion of the topmost surface of said carbon dopant is in direct contact with an entire bottommost surface of said second high-k gate dielectric layer.

\* \* \* \* \*